(12) United States Patent
Ito et al.

(10) Patent No.: US 7,796,237 B2
(45) Date of Patent: Sep. 14, 2010

(54) LITHOGRAPHY APPARATUS, METHOD OF FORMING PATTERN AND METHOD OF MANUFACTURING SEMICONDUCTOR DEVICE

(75) Inventors: Shinichi Ito, Yokohama (JP); Tsuyoshi Shibata, Kikuchi-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 40 days.

(21) Appl. No.: 12/341,179

(22) Filed: Dec. 22, 2008

(65) Prior Publication Data

US 2009/0109414 A1    Apr. 30, 2009

Related U.S. Application Data

(62) Division of application No. 11/174,722, filed on Jul. 6, 2005, now Pat. No. 7,477,353.

(30) Foreign Application Priority Data

Jul. 7, 2004    (JP) .............................. 2004-201011

(51) Int. Cl.
*G03B 27/52* (2006.01)
*G03B 27/42* (2006.01)
*G03B 27/32* (2006.01)
*G03D 5/00* (2006.01)

(52) U.S. Cl. .............................. 355/30; 355/27; 355/53; 396/611

(58) Field of Classification Search .................. 355/27, 355/39, 53, 72, 77; 396/611
See application file for complete search history.

(56) References Cited

U.S. PATENT DOCUMENTS

| 4,974,018 | A | 11/1990 | Komoriya et al. |
| 6,183,147 | B1 | 2/2001 | Kimura et al. |
| 6,319,322 | B1 * | 11/2001 | Ueda et al. .................. 118/666 |

(Continued)

FOREIGN PATENT DOCUMENTS

JP    5-234839    9/1993

(Continued)

OTHER PUBLICATIONS

English Translation of JP 2000-091226 (dated Mar. 31, 2000).*

(Continued)

*Primary Examiner*—Alan A Mathews
(74) *Attorney, Agent, or Firm*—Finnegan, Henderson, Farabow, Garrett & Dunner, L.L.P.

(57) ABSTRACT

A lithography apparatus includes a resist processing apparatus to perform a process of applying a resist on a substrate, a process of heating a resist film on the substrate, and a process of developing the resist film on the substrate, an immersion exposure apparatus including a projection optical system which projects an image of a pattern on a photomask onto the resist film and configured to perform exposure through liquid located on an optical path between the projection optical system and resist film, a transporting apparatus connected to the resist processing and immersion exposure apparatuses to perform transportation of the substrate between the resist processing and immersion exposure apparatuses, and a temperature/humidity control apparatus configured to control at least one of temperature and humidity in at least one of the resist processing and transporting apparatuses based on temperature and humidity or the in humidity the immersion exposure apparatus.

10 Claims, 7 Drawing Sheets

U.S. PATENT DOCUMENTS

| | | |
|---|---|---|
| 6,952,253 B2 | 10/2005 | Lof et al. |
| 2005/0046934 A1 | 3/2005 | Ho et al. |
| 2005/0225735 A1 | 10/2005 | Magome et al. |

FOREIGN PATENT DOCUMENTS

| | | |
|---|---|---|
| JP | 09-199462 | 7/1997 |
| JP | 10-284405 | 10/1998 |
| JP | 10-340846 | 12/1998 |
| JP | 11-260884 | 9/1999 |
| JP | 2000-91226 | 3/2000 |
| JP | 2000-188253 | 7/2000 |
| JP | 2002-175976 | 6/2002 |
| JP | 2003-124283 | 4/2003 |
| JP | 2005-101487 | 4/2005 |
| WO | WO 2004/053952 A1 | 6/2004 |

OTHER PUBLICATIONS

English Translation of JP 2003-124283 (dated Apr. 25, 2003).*
Ito, "Resist Pattern Forming Method, Semiconductor Apparatus Using Said Method, and Exposure Apparatus Thereof", U.S. Appl. No. 11/084,001, filed Mar. 21, 2005.
Owa et al., "Update on 193nm immersion exposure tool," Immersion Workshop 2004 (Jan. 27, 2004), pp. 1-38.
Notification of Reasons for Rejection issued by Japanese Patent Office on Mar. 16, 2010 in Japanese application No. 2004-201011 and English translation thereof.

* cited by examiner

LITHOGRAPHY APPARATUS, METHOD OF FORMING PATTERN AND METHOD OF MANUFACTURING SEMICONDUCTOR DEVICE

CROSS-REFERENCE TO RELATED APPLICATIONS

This application is a division of U.S. application Ser. No. 11/174,722, filed Jul. 6, 2005 now U.S. Pat. No. 7,477,353, which is based upon and claims the benefit of priority from prior Japanese Patent Application No. 2004-201011, filed Jul. 7, 2004. The entire contents of these applications are incorporated herein by reference in their entirety.

BACKGROUND OF THE INVENTION

1. Field of the Invention

The present invention relates to a lithography apparatus using an immersion exposure apparatus, a method for forming a pattern and a method for manufacturing a semiconductor device.

2. Description of the Related Art

As a semiconductor manufacturing apparatus, a lithography apparatus is known. The lithography apparatus includes a resist processing apparatus, a transporting apparatus connected to the resist processing apparatus, and an exposure apparatus connected to the transporting apparatus. Transporting of a wafer between the resist processing apparatus and the exposure apparatus is performed through the transporting apparatus.

In a conventional lithography apparatus, temperature and humidity in a transporting apparatus are not controlled. Even though the temperature and the humidity are controlled, the temperature and the humidity in the transporting apparatus are controlled independently of the environment in the exposure apparatus.

A window for exchanging a wafer is formed between the exposure apparatus and the transporting apparatus. In the conventional lithography apparatus, air in the exposure apparatus flows into the transporting apparatus through the window.

The air flow does not pose any problem when a conventional dry exposure apparatus is used. However, the air flow poses a problem when an immersion exposure apparatus (Jpn. Pat. Appln. KOKAI Publication No. 10-340846) in which a high-humidity state is set near a wafer stage. That is, the temperature and the humidity in the exposure apparatus are difficult to keep constant, and the temperature of a wafer transferred into the exposure apparatus from the transporting apparatus disadvantageously varies. Hereby, dimensional controllability and alignment accuracy which are important in the lithography step are degraded, so that a designed resist pattern can be hardly formed.

Furthermore, when an immersion exposure apparatus is used, there is a case that moisture remains on a surface of wafer which the immersion exposure has finished, or moisture remains on a rear surface of the wafer by material educed from the resist film on a surface during the exposure (announcement from Nikon Corporation in an immersion exposure workshop: Nikon, hyperlink address is sematech.org/resources/litho/meetings/immersion/20040128/index.htm)). When the wafer in such a state is processed in the resist processing apparatus, contamination occurs in the resist processing apparatus.

BRIEF SUMMARY OF THE INVENTION

According to an aspect of the present invention, there is provided a lithography apparatus comprising: a resist processing apparatus to perform a process of applying a resist on a substrate to be processed, a process of heating a resist film formed on the substrate, and a process of developing the resist film formed on the substrate; an immersion exposure apparatus including a projection optical system which projects an image of a pattern formed on a photomask onto the resist film formed on the substrate and configured to perform exposure through liquid located on an optical path between the projection optical system and the resist film; a transporting apparatus connected to the resist processing apparatus and the immersion exposure apparatus to perform transportation of the substrate between the resist processing apparatus and the immersion exposure apparatus; and a temperature/humidity control apparatus configured to control temperature and humidity or the humidity in at least one of the resist processing apparatus and the transporting apparatus based on temperature and humidity or the humidity in the immersion exposure apparatus.

According to another aspect of the present invention, there is provided a lithography apparatus comprising: a resist processing apparatus to perform a process of applying a resist on a substrate to be processed, a process of heating a resist film formed on the substrate, and a process of developing the resist film formed on the substrate; an immersion exposure apparatus including a projection optical system to project an image of a pattern formed on a photomask onto the resist film formed on the substrate and configured to perform exposure through liquid located on an optical path between the projection optical system and the resist film; a transporting apparatus connected to the resist processing apparatus and the immersion exposure apparatus and configured to carry the substrate between the resist processing apparatus and the immersion exposure apparatus; and an openable and closable shutter provided on at least one portion on a transporting path of the substrate between the resist processing apparatus and the immersion exposure apparatus.

According to an aspect of the present invention, there is provided a method for forming a pattern comprising: transporting a substrate to be processed into a resist processing apparatus; forming a resist film on the substrate by applying a resist on the substrate using the resist processing apparatus; transporting the substrate in the resist processing apparatus into a transporting apparatus connected to the resist processing apparatus; controlling temperature and humidity or the humidity in the transporting apparatus based on temperature and humidity or the humidity in an immersion exposure apparatus connected to the transporting apparatus; transporting the substrate in the transporting apparatus into the immersion exposure apparatus which the at least one of the temperature and humidity is controlled; performing pattern exposure to the resist film on the substrate using the immersion exposure apparatus; transporting the substrate in the immersion exposure apparatus into the resist processing apparatus; and forming a resist pattern by performing a baking process and a developing process to the resist film which the pattern exposure to the substrate is performed using the resist processing apparatus.

According to another aspect of the present invention, there is provided a method for forming a pattern comprising: transporting a substrate to be processed into a resist processing apparatus; forming a resist film on the substrate by applying a resist on the substrate using the resist processing apparatus; transporting the substrate in the resist processing apparatus into a transporting apparatus connected to the resist processing apparatus; transporting the substrate in the transporting apparatus into an immersion exposure apparatus connected to the transporting apparatus; performing pattern exposure to the resist film on the substrate using the immersion exposure apparatus; transporting the substrate in the immersion exposure apparatus into the transporting apparatus; controlling at temperature and humidity or the humidity in the resist processing apparatus based on temperature and humidity or the humidity in the immersion exposure apparatus; transporting the substrate in the transporting apparatus into the resist processing apparatus which the temperature and the humidity or the humidity is controlled; and forming a resist pattern by performing a baking process and a developing process to the resist film which the pattern exposure to the substrate is performed using the resist processing apparatus.

According to another aspect of the present invention, there is provided a lithography apparatus comprising: a resist processing apparatus to perform a process of applying a resist on a substrate to be processed, a process of heating a resist film formed on the substrate, and a process of developing the resist film formed on the substrate; an immersion exposure apparatus including a projection optical system to project an image of a pattern formed on a photomask onto the resist film formed on the substrate and configured to perform exposure through liquid located on an optical path between the projection optical system and the resist film; and a liquid removing apparatus provided on a transporting path of the substrate between the immersion exposure apparatus and the resist processing apparatus and configured to remove liquid on a surface of the substrate.

According to another aspect of the present invention, there is provided a lithography apparatus comprising: a resist processing apparatus to perform a process of applying a resist on a substrate to be processed, a process of heating a resist film formed on the substrate, and a process of developing the resist film formed on the substrate; an immersion exposure apparatus including a projection optical system to project an image of a pattern formed on a photomask onto the resist film formed on the substrate and configured to perform exposure through liquid located on an optical path between the projection optical system and the resist film; and a cleaning apparatus provided on a transporting path of the substrate between the immersion exposure apparatus and the resist processing apparatus and configured to clean at least one of a rear surface and a side surface of the substrate.

According to another aspect of the present invention, there is provided a method for forming a pattern comprising: transporting a substrate to be processed into a resist processing apparatus; forming a resist film on the substrate by applying a resist on the substrate using the resist processing apparatus; transporting the substrate in the resist processing apparatus into a transporting apparatus connected to the resist processing apparatus; transporting the substrate in the resist processing apparatus into an immersion exposure apparatus connected to the transporting apparatus; performing pattern exposure to the resist film on the substrate using the immersion exposure apparatus; transporting the substrate in the immersion exposure apparatus into the resist processing apparatus; removing liquid on a surface of the substrate in the middle of a transporting path of the substrate between the immersion exposure apparatus and the resist processing apparatus after the performing pattern exposure and before the transporting the substrate in the exposure apparatus into the resist processing apparatus; and forming a resist pattern by performing a baking process and a developing process to the resist film which the pattern exposure to the substrate is performed using the resist processing apparatus.

According to another aspect of the present invention, there is provided a method for forming a pattern comprising: transporting a substrate to be processed into a resist processing apparatus; forming a resist film on the substrate by applying a resist on the substrate using the resist processing apparatus; transporting the substrate in the transporting apparatus into a transporting apparatus connected to the resist processing apparatus; transporting the substrate in the resist processing apparatus into an immersion exposure apparatus connected to the transporting apparatus; performing pattern exposure to the resist film on the substrate using the immersion exposure apparatus; transporting the substrate in the immersion exposure apparatus into the resist processing apparatus; cleaning at least on of a rear surface and side surface of the substrate in the middle of a transporting path of the substrate between the immersion exposure apparatus and the resist processing apparatus after the performing the pattern exposure and before the transporting the substrate in the exposure apparatus into the resist processing apparatus; and forming a resist pattern by performing a baking process and a developing process to the resist film which the pattern exposure to the substrate is performed using the resist processing apparatus.

According to an aspect of the present invention, there is provided a method for manufacturing a semiconductor device comprising: transporting a substrate to be processed into a resist processing apparatus; forming a resist film on the substrate by applying a resist on the substrate using the resist processing apparatus; transporting the substrate in the resist processing apparatus into a transporting apparatus connected to the resist processing apparatus; controlling temperature and humidity or the humidity in the transporting apparatus based on temperature and humidity or the humidity in an immersion exposure apparatus connected to the transporting apparatus; transporting the substrate in the transporting apparatus into the immersion exposure apparatus which the at least one of the temperature and humidity is controlled; performing pattern exposure to the resist film on the substrate using the immersion exposure apparatus; transporting the substrate in the immersion exposure apparatus into the resist processing apparatus; and forming a resist pattern by performing a baking process and a developing process to the resist film which the pattern exposure to the substrate is performed using the resist processing apparatus.

According to another aspect of the present invention, there is provided a method for manufacturing a semiconductor device comprising: transporting a substrate to be processed into a resist processing apparatus; forming a resist film on the substrate by applying a resist on the substrate using the resist processing apparatus; transporting the substrate in the resist processing apparatus into a transporting apparatus connected to the resist processing apparatus; transporting the substrate in the transporting apparatus into an immersion exposure apparatus connected to the transporting apparatus; performing pattern exposure to the resist film on the substrate using the immersion exposure apparatus; transporting the substrate in the immersion exposure apparatus into the transporting apparatus; controlling at temperature and humidity or the humidity in the resist processing apparatus based on temperature and humidity or the humidity in the immersion exposure apparatus; transporting the substrate in the transporting apparatus into the resist processing apparatus which the temperature and the humidity or the humidity is controlled; and forming a resist pattern by performing a baking process and a developing process to the resist film which the pattern exposure to the substrate is performed using the resist processing apparatus.

According to another aspect of the present invention, there is provided a method for manufacturing a semiconductor device comprising: transporting a substrate to be processed into a resist processing apparatus; forming a resist film on the substrate by applying a resist on the substrate using the resist processing apparatus; transporting the substrate in the resist processing apparatus into a transporting apparatus connected to the resist processing apparatus; transporting the substrate in the resist processing apparatus into an immersion exposure apparatus connected to the transporting apparatus; performing pattern exposure to the resist film on the substrate using the immersion exposure apparatus; transporting the substrate in the immersion exposure apparatus into the resist processing apparatus; removing liquid on a surface of the substrate in the middle of a transporting path of the substrate between the immersion exposure apparatus and the resist processing apparatus after the performing pattern exposure and before the transporting the substrate in the exposure apparatus into the resist processing apparatus; and forming a resist pattern by performing a baking process and a developing process to the resist film which the pattern exposure to the substrate is performed using the resist processing apparatus.

According to another aspect of the present invention, there is provided a method for manufacturing a semiconductor device comprising: transporting a substrate to be processed into a resist processing apparatus; forming a resist film on the substrate by applying a resist on the substrate using the resist processing apparatus; transporting the substrate in the transporting apparatus into a transporting apparatus connected to the resist processing apparatus; transporting the substrate in the resist processing apparatus into an immersion exposure apparatus connected to the transporting apparatus; performing pattern exposure to the resist film on the substrate using the immersion exposure apparatus; transporting the substrate in the immersion exposure apparatus into the resist processing apparatus; cleaning at least one of a rear surface and side surface of the substrate in the middle of a transporting path of the substrate between the immersion exposure apparatus and the resist processing apparatus after the performing the pattern exposure and before the transporting the substrate in the exposure apparatus into the resist processing apparatus; and forming a resist pattern by performing a baking process and a developing process to the resist film which the pattern exposure to the substrate is performed using the resist processing apparatus.

DETAILED DESCRIPTION OF THE INVENTION

Embodiments of the present invention will be described below with reference to the accompanying drawings.

First Embodiment

Figure 1:
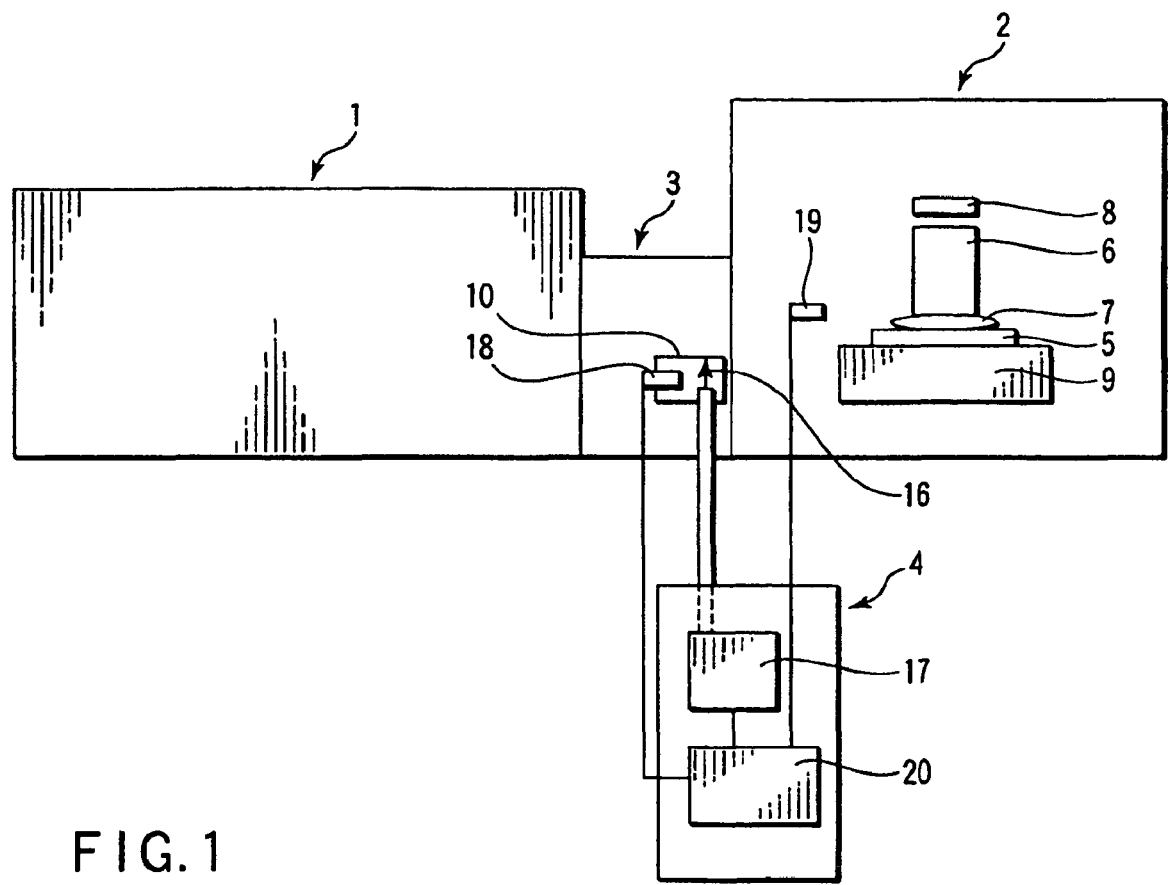
FIG. 1 is a diagram showing a schematic configuration of a lithography apparatus according to the first embodiment of the present invention.

FIG. 1 is a diagram showing a schematic configuration of a lithography apparatus according to the first embodiment of the present invention.

The lithography apparatus of the present embodiment includes a resist processing apparatus 1, an exposure apparatus 2, a transporting apparatus 3, and a temperature/humidity control unit (temperature/humidity control apparatus) 4.

The resist processing apparatus 1 is a device to perform a process of applying a resist on a wafer (substrate to be processed), a process of heating the resist film formed on the wafer, and a process of developing the resist film formed on the wafer.

The exposure apparatus 2 is an immersion ArF exposure apparatus which includes a projection optical system including a projector lens 6 which projects an image of a pattern formed on a photomask onto the resist film formed on a wafer 5, and which performs exposure through a liquid (immersion liquid) 7 located in an optical path between the projection optical system and the resist film.

The immersion liquid 7 is typically pure water for ArF immersion exposure. The immersion liquid 7 is supplied by a liquid supply mechanism (not shown) into a portion between the resist film formed on the wafer 5 and the projector lens 6.

Pattern exposure to the resist film is performed as follows. That is, exposure light (ArF laser) generated from an ArF light source (not shown) is irradiated on a photomask 8, and the exposure light passing through the photomask 8 is irradiated on the wafer 5 placed on a wafer stage 9 through the projector lens 6 and the immersion liquid 7, so that the pattern exposure is performed. An exposure light source except for the ArF light source can be used.

The transporting apparatus 3 is a device to convey the wafer 5 between the resist processing apparatus 1 and the exposure apparatus 2. A waiting unit 10 is provided in the transporting apparatus 3. The waiting unit 10 is a unit to cause the wafer 5 to wait for a predetermined period before the wafer 5 set in the resist processing apparatus 1 and having the resist film formed thereon is transported into the exposure apparatus 2 or before the wafer 5 to which an exposure process (pattern exposure) is performed in the exposure apparatus 2 is inserted into the resist processing apparatus 1.

Figure 2:
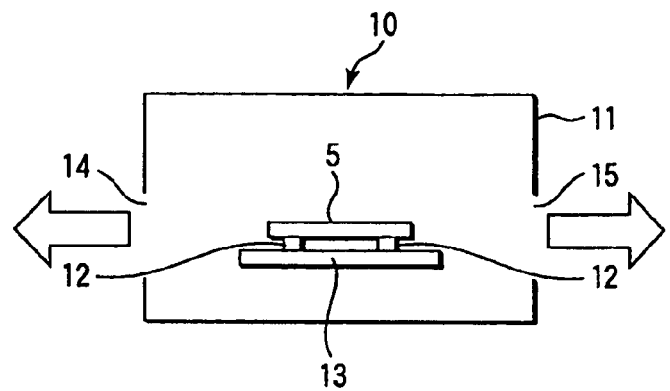
FIG. 2 is a diagram showing a specific configuration of a waiting unit of the embodiment.

The waiting unit 10, as shown in FIG. 2, includes a waiting chamber 11 to cause the wafer 5 to wait therein and a waiting stage 13 provided in the waiting chamber 11 and having substrate support pins 12. The wafer 5 is placed on the substrate support pins 12. Portions except for substrate exchange ports 14 and 15 of the waiting unit 10 are shielded such that air cannot flow between the resist processing apparatus 1 and the transporting apparatus 3 and between the transporting apparatus 3 and the exposure apparatus 2.

The temperature/humidity control unit 4 is a unit to control temperature and humidity or the humidity in the waiting unit 10 such that the temperature of the wafer is suppressed from varying on the basis of the temperature and humidity at a designated place (for example, near a wafer stage) in the exposure apparatus 2 when the wafer in the waiting unit 10 is transported into the exposure apparatus 2. For this purpose, for example, the temperature and the humidity in the waiting unit 10 are controlled to be equal to the temperature and the humidity in the exposure apparatus 2.

The temperature and the humidity in the waiting unit 10 and the temperature and the humidity in the exposure apparatus 2, or the humidity in the waiting unit 10 and the humidity in the exposure apparatus 2 are monitored, and the temperature of the wafer can also be suppressed from varying on the basis of temperature and humidity information in the waiting unit 10 and temperature and humidity information in the exposure apparatus 2, or the humidity information in the waiting unit 10 and the humidity information in the exposure apparatus 2.

The temperature/humidity control unit 4 includes an air supply unit 17 to supply air 16 controlled in temperature and humidity into the waiting unit 10, the first temperature/humidity sensor 18 to monitor temperature and humidity at a designated place in the waiting unit 10, the second temperature/humidity sensor 19 to monitor temperature and humidity at a designated place in the exposure apparatus 2, and a control unit 20 which controls the air supply unit 17 such that the air 16 which suppresses the temperature of the wafer from varying is supplied into the waiting unit 10 when the wafer in the waiting unit 10 is transported into the exposure apparatus 2 on the basis of the temperature information and the humidity information obtained by the first and second temperature sensors 18 and 19.

According to the present embodiment, in comparison with a conventional lithography apparatus in which temperature and humidity around a wafer are not controlled before the wafer is inserted into an exposure apparatus or temperature and humidity in a transporting apparatus are controlled independently of temperature and humidity in the exposure apparatus, variations in the temperature and humidity in the exposure apparatus 2 caused by an increase in the number of wafers 5 to be subjected to an exposure process in the exposure apparatus 2 can be effectively reduced. As a result, dimensional controllability and alignment accuracy which are important in a lithography step are improved to make it possible to easily form a designed resist pattern.

In the present embodiment, the case in which the temperature and the humidity are monitored is described above. However, control may be performed by monitoring the humidity (as well as the other embodiments). In this case, since variations in the temperature or the humidity in the exposure apparatus 2 can be made smaller than those in the prior art, a designed resist pattern can be easily formed.

A method of forming a pattern using the lithography apparatus of the present embodiment will be described below.

At first, wafer 5 is transported into the resist processing apparatus 1. Thereafter, a resist is applied on the wafer 5 by the resist processing apparatus 1 to form a resist film on the wafer 5. In the present embodiment, the wafer 5 is a raw wafer or a wafer on which a part of a device is already formed.

Next, the wafer 5 is carried out of the resist processing apparatus 1 and carried into the waiting unit 10 of the transporting apparatus 3.

Next, in a state that the wafer 5 waits in the waiting unit 10, temperature and humidity information, and humidity information in the waiting unit 10 and the exposure apparatus 2 are obtained by the first and second temperature/humidity sensors 18 and 19.

On the basis of the obtained temperature and humidity information and the obtained humidity information, the control unit 20 controls the air supply unit 17.

In the concrete, when the wafer 5 is transported into the exposure apparatus 2 from the waiting unit 10, the control unit 20 controls the air supply unit 17 such that the air 16 having temperature and humidity at which a variation in the temperature of the wafer 5 is sufficiently suppressed is supplied in the waiting unit 10.

In this manner, the temperature and the humidity (in-device environment) in the transporting apparatus 3 (waiting unit 10) is controlled in consideration of the temperature and the humidity (in-device environment) in the exposure apparatus 2, so that the variation in temperature of the wafer 5 is sufficiently suppressed in the step of conveying the wafer 5 between the transporting apparatus 3 and the exposure apparatus 2.

Next, the wafer 5 is transported into the exposure apparatus 2 from the waiting unit 10. Thereafter, pattern exposure is performed in a state that the immersion liquid 7 is interposed between the resist film and the projector lens 6. At this time, as described above, since the variation in the temperature of the wafer 5 is sufficiently suppressed, dimensional controllability and alignment accuracy which are important in the lithography step are prevented from being degraded.

Next, the wafer 5 is then transported into the transporting apparatus 3 from the exposure apparatus 2.

Next, the wafer 5 is held in the transporting apparatus 3 for a predetermined period and then carried into the resist processing apparatus 1.

Thereafter, the known steps such as the step of etching of the wafer 5 by using the resist pattern as a mask are performed, so that a semiconductor device is completed.

Second Embodiment

Figure 3:
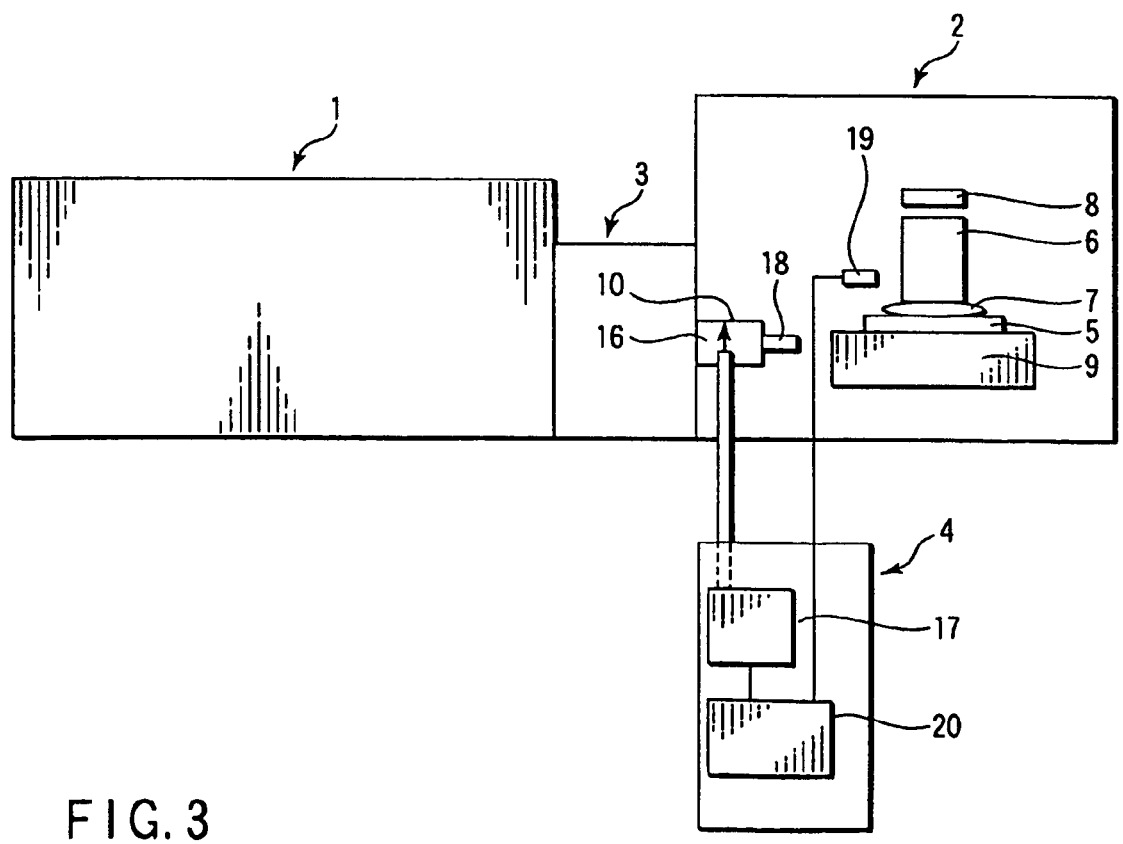
FIG. 3 is a diagram showing a schematic configuration of a lithography apparatus according to the second embodiment of the present invention.

FIG. 3 is a diagram showing a schematic configuration of a lithography apparatus according to the second embodiment of the present invention. The same reference numerals as in FIG. 1 denote the same parts in FIG. 3, and a detailed description (configuration, effect, and the like) thereof will be omitted.

The present embodiment is different from the first embodiment in that a waiting unit 10 is provided in an exposure apparatus 2. In the present embodiment, the first temperature/humidity sensor 18 to monitor temperature and humidity in the waiting unit 10 is provided in the exposure apparatus 2. For this reason, the second temperature/humidity sensor 19 to monitor temperature and humidity in the exposure apparatus 2 is preferably provided near a place (use point) where pattern exposure is actually performed, e.g., a place near a wafer stage.

A pattern forming method using the lithography apparatus of the present embodiment will be described below.

At first, the wafer 5 is carried into the resist processing apparatus 1. Thereafter, the resist processing apparatus 1 applies the resist on the wafer 5 to form the resist film on the wafer 5.

Next, the wafer 5 is carried out of the resist processing apparatus 1 and carried into the waiting unit 10 of the exposure apparatus 2 through a transporting apparatus 3.

Next, in a state that the wafer 5 waits in the waiting unit 10, the temperature and humidity information and the humidity information of the waiting unit 10 in the exposure apparatus 2 and of near the use point are obtained by the first and second temperature/humidity sensors 18 and 19.

On the basis of the obtained temperature and humidity information and the obtained humidity information, the control unit 20 controls the air supply unit 17. In the concrete, when the wafer 5 is transported onto a wafer stage 9 from the inside of the waiting unit 10, the control unit 20 controls the air supply unit 17 such that air 16 having temperature and humidity which suppress the temperature of the wafer 5 near the use point from varying is supplied into the waiting unit 10. For this purpose, for example, the temperature and the humidity in the waiting unit 10 are controlled to be equal to those near the use point.

The temperature and humidity in the waiting unit 10 and the temperature and humidity near the use point, or the humidity in the waiting unit 10 and the humidity near the use point are monitored, and the temperature of the wafer can also be suppressed from varying on the basis of temperature and humidity information in the waiting unit 10 and the temperature and humidity information near the user point, or the humidity information in the waiting unit 10 and the humidity information near the use point.

In this manner, the temperature and the humidity in the waiting unit 10 are controlled in consideration of the temperature and the humidity near the use point in the exposure apparatus 2 to sufficiently suppress the temperature of the wafer 5 near the use point from varying in the step of transporting the wafer 5 between the waiting unit 10 and the use point.

Next, the wafer 5 is transported onto the wafer stage 9 from the inside of the waiting unit 10. Thereafter, the pattern exposure is performed in a state that an immersion liquid 7 is interposed between the resist film and a projector lens 6. At this time, as described above, since the variation in the temperature of the wafer 5 is sufficiently suppressed near the use point, dimensional controllability and alignment accuracy which are important in the lithography step are prevented from being degraded.

Next, the wafer 5 is transported into the transporting apparatus 3 from the exposure apparatus 2.

Next, the wafer 5 is held in the transporting apparatus 3 for a predetermined period and then transported into the resist processing apparatus 1.

Next, the baking process is performed to the resist film of the wafer 5 to which the pattern exposure is performed by the resist processing apparatus 1, further, the developing process is performed to the resist film of the wafer 5. As a result, the resist pattern is formed on the wafer 5.

Thereafter, the known steps such as the step of etching of the wafer 5 by using the resist pattern as a mask are performed, so that a semiconductor device is completed.

Third Embodiment

Figure 4:
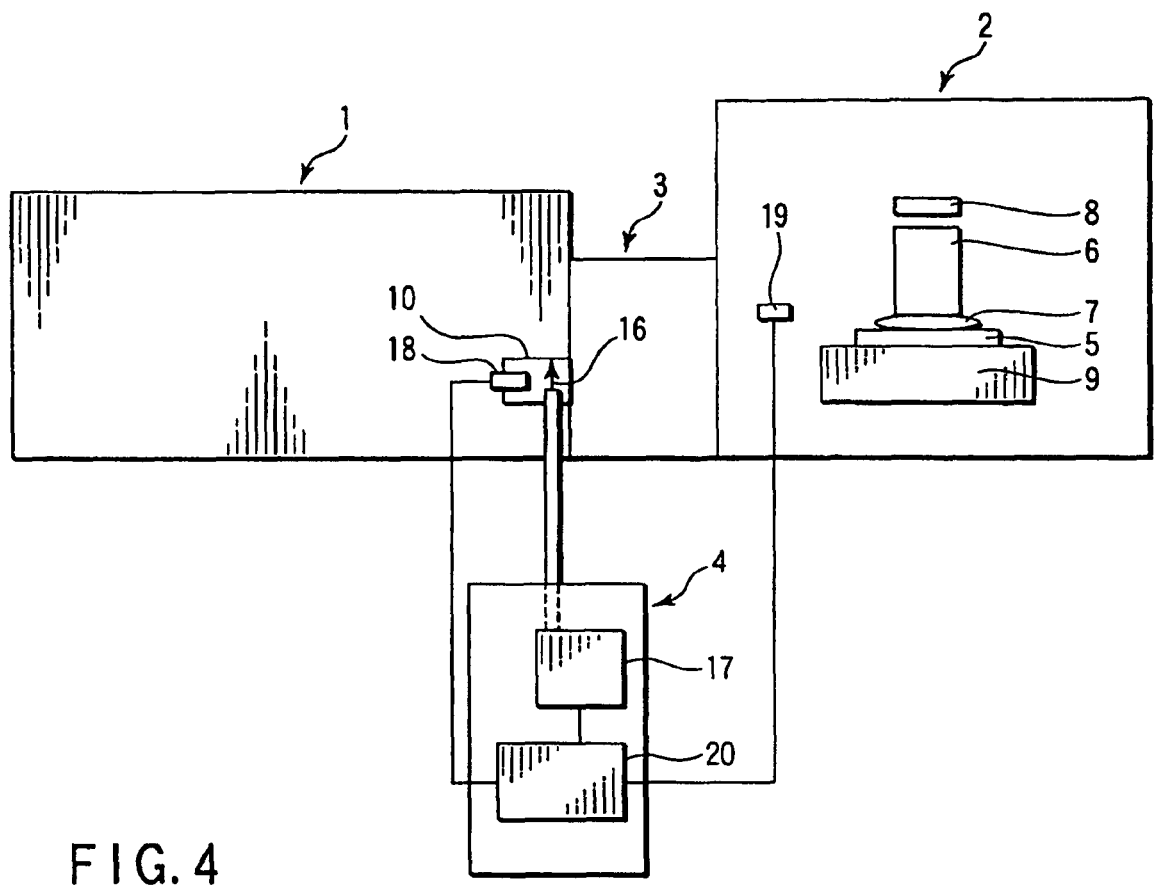
FIG. 4 is a diagram showing a schematic configuration of a lithography apparatus according to the third embodiment of the present invention.

FIG. 4 is a diagram showing a schematic configuration of a lithography apparatus according to the third embodiment of the present invention. The same reference numerals as in FIG. 1 denote the same parts in FIG. 4, and a detailed description (configuration, effect, and the like) thereof will be omitted.

The present embodiment is different from the first embodiment in that a waiting unit 10 is provided in the resist processing apparatus 1.

A pattern forming method using the lithography apparatus of the present embodiment will be described below.

At first, the wafer 5 is transported into the resist processing apparatus 1. Thereafter, the resist processing apparatus 1 applies the resist on the wafer 5 to form the resist film on the wafer 5.

The wafer 5 is carried into the waiting unit 10 in the resist processing apparatus 1.

In a state that the wafer 5 waits in the waiting unit 10, the temperature and humidity information and the humidity information of the waiting unit 10 (resist processing apparatus 1) and the exposure apparatus 2 are obtained by the first and second temperature/humidity sensors 18 and 19.

The control unit 20 controls the air supply unit 17 on the basis of the obtained temperature and humidity information and the obtained humidity information.

In the concrete, when the wafer 5 is transported into the exposure apparatus 2 from the inside of the waiting unit 10 through the transporting apparatus 3, the control unit 20 controls the air supply unit 17 such that air 16 having temperature and humidity which suppress the temperature of the wafer 5 from varying is supplied into the waiting unit 10. For this purpose, for example, the temperature and the humidity in the waiting unit 10 are controlled to be equal to those in the exposure apparatus 2.

The temperature and humidity in the waiting unit 10 and the temperature and humidity in the exposure apparatus 2, or the humidity in the waiting unit 10 and the humidity in the exposure apparatus 2 are monitored, and the temperature of the wafer can also be suppressed from varying on the basis of the temperature and humidity information in the waiting unit 10 and the temperature and humidity information in the exposure apparatus 2, or the humidity information in the waiting unit 10 and the humidity information in the exposure apparatus 2.

In this manner, the temperature and the humidity in the resist processing apparatus 1 are controlled in consideration of the temperature and the humidity in the exposure apparatus 2 to sufficiently suppress the temperature of the wafer 5 from varying in the step of transporting the wafer 5 between the resist processing apparatus 1 and the exposure apparatus 2.

Next, the wafer 5 is transported into the exposure apparatus 2 from the inside of the waiting unit 10 (resist processing apparatus 1) through the transporting apparatus 3. At this time, as described above, the temperature of the wafer 5 can be sufficiently suppressed from varying.

Next, the pattern exposure is performed in a state that an immersion liquid 7 is interposed between the resist film and a projector lens 6. At this time, as described above, since the variation in the temperature of the wafer 5 is sufficiently suppressed, dimensional controllability and alignment accuracy which are important in the lithography step are prevented from being degraded.

Next, in a state that the wafer 5 waits in the waiting unit 10, temperature information and humidity information in the waiting unit 10 (resist processing apparatus 1) and the exposure apparatus 2 are obtained again by the first and second temperature/humidity sensors 18 and 19.

The control unit 20 controls the air supply unit 17 on the basis of the temperature information and humidity information obtained above.

In the concrete, when the wafer 5 is transported into the waiting unit 10 (resist processing apparatus 1) from the inside of the exposure apparatus 2 through the transporting apparatus 3, the control unit 20 controls the air supply unit 17 such that the air 16 having temperature and humidity which suppress the temperature of the wafer 5 from varying is supplied into the waiting unit 10 as described above.

Here, in case of immersion exposure, the resist film is applied with pattern exposure while being dipped in the liquid in the exposure apparatus 2, and then the wafer is transported into the resist processing apparatus 1. For this reason, the temperature and the humidity in the resist processing apparatus 1 easily varies depending on moisture remaining on the wafer.

However, in the present embodiment, as described above, since the temperature and the humidity in the resist processing apparatus 1 are controlled in consideration of the temperature and the humidity in the exposure apparatus 2, the variation in the temperature of the wafer 5 is sufficiently suppressed in the step of transporting the wafer 5 between the exposure apparatus 2 and the resist processing apparatus 1.

Next, the wafer 5 is transported into the waiting unit 10 of the resist processing apparatus 1 from the inside of the exposure apparatus 2 through the transporting apparatus 3. At this time, as described above, the variations in the temperature and the humidity in the resist processing apparatus 1 are sufficiently suppressed.

Next, a baking process is performed to the resist film of the wafer 5 to which the pattern exposure is performed by the resist processing apparatus 1, further, a developing process is performed to the resist film of the wafer 5. As a result, a resist pattern is formed on the wafer 5. At this time, as described above, since the variation in the temperature of the wafer 5 is sufficiently suppressed, the baking process and the developing process are normally performed, and a desired resist pattern can be obtained.

Thereafter, the known steps such as the step of etching of the wafer 5 by using the resist pattern as a mask are performed, so that a semiconductor device is completed.

The present embodiment explains that the variation in the temperature of the wafer 5 is suppressed when the wafer 5 is transported into the exposure apparatus 2 from the inside of the resist processing apparatus 1 through the transporting apparatus 3 and when the wafer 5 is transported into the resist processing apparatus 1 from the inside of the exposure apparatus 2 through the transporting apparatus 3. However, the variation in the temperature of the wafer 5 may be suppressed in one of these cases.

Fourth Embodiment

Figure 5:
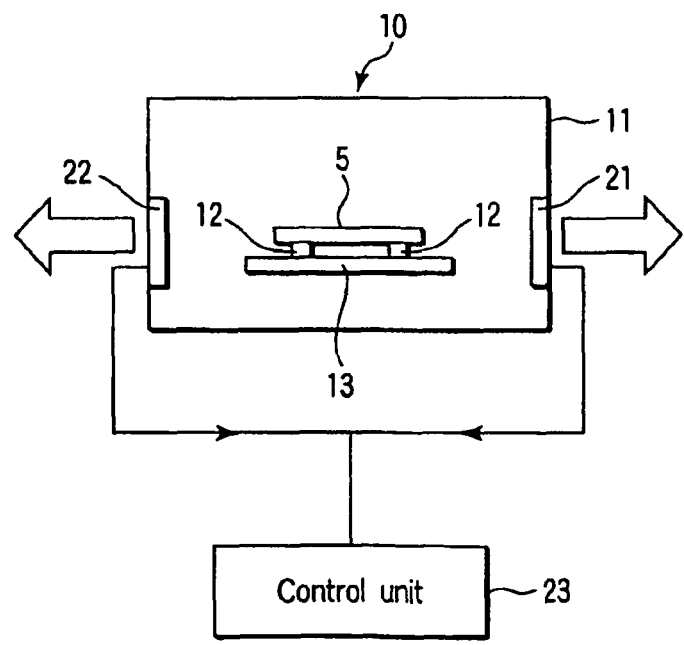
FIG. 5 is a diagram showing a schematic configuration of waiting unit in a lithography apparatus according to the fourth embodiment of the present invention.

FIG. 5 is a diagram showing a schematic configuration of a waiting unit in a lithography apparatus according to the fourth embodiment of the present invention. The same reference numerals as in FIG. 2 denote the same parts in FIG. 5, and a detailed description (configuration, effect, and the like) thereof will be omitted.

The present embodiment is different from the first to third embodiments in that an openable and closable shutter is provided on at least one portion of a transporting path between the resist processing apparatus and the exposure apparatus for a wafer.

FIG. 5 shows an example in which openable and closable shutters are provided on two portions. That is, in FIG. 5, the first openable and closable shutter 21 provided on the substrate exchange port on the exposure apparatus side of a waiting unit 10 and the second openable and closable shutter 22 provided on the substrate exchange port on the resist processing apparatus side of the waiting unit 10 are shown.

Furthermore, the present embodiment, the lithography apparatus comprises a control unit 23 which controls the first and second shutters 21 and 22 is provided. The control of the first and second shutters 21 and 22 performed by the control unit 23 when the waiting unit 10 is in the transporting apparatus 3 (first embodiment) will be described below in detail.

The first shutter 21 is controlled by the control unit 23 such that the first shutter 21 is closed except when a wafer 5 is transported into the exposure apparatus 2 from the inside of the transporting apparatus 3 and when the wafer 5 is transported into the transporting apparatus 3 from the inside of the exposure apparatus 2. In this manner, high humidity air in the exposure apparatus 2 can be prevented from unnecessarily flowing into the transporting apparatus 3 side. As a result, the temperature and the humidity in the exposure apparatus 2 can be easily kept constant.

The second shutter 22 is controlled by the control unit 23 such that the second shutter 22 is closed except when the wafer 5 is transported into the resist processing apparatus 1 from the inside of the transporting apparatus 3 and when the wafer 5 is transported into the transporting apparatus 3 from the inside of the resist processing apparatus 1. In this manner, air can be prevented from moving between the resist processing apparatus 1 and the transporting apparatus 3. As a result, the temperature and the humidity in the resist processing apparatus 1 can be easily kept constant.

Further, before the wafer 5 in the waiting unit 10 of the transporting apparatus 3 is transported into the exposure apparatus 2, while the first and second shutters 21 and 22 are in closed states, as described in the first embodiment, the temperature and the humidity in the waiting unit 10 are controlled by air 16. Thereafter, as described above, the first and second shutters 21 and 22 are controlled, and the wafer 5 is transported.

Here, the case in which the waiting unit 10 is set in the transporting apparatus 3 is described above. However, the present embodiment can be executed in the same manner as described above even though the waiting unit 10 is set in the exposure apparatus 2 or the resist processing apparatus 1.

The present embodiment can be modified as follows.

(1) Only one of the first and second shutters 21 and 22 is employed.

(2) The first openable and closable shutter is provided on a connection portion between the transporting apparatus 3 and the exposure apparatus 2, not in the waiting unit 10.

(3) The second openable and closable shutter is provided on a connection portion between the transporting apparatus 3 and the resist processing apparatus 1, not in the waiting unit 10.

(4) The first and second shutters in the items (2) and (3) are provided.

(5) In the items (2) to (4), the temperature/humidity control unit 4 is omitted.

Fifth Embodiment

Figure 6:
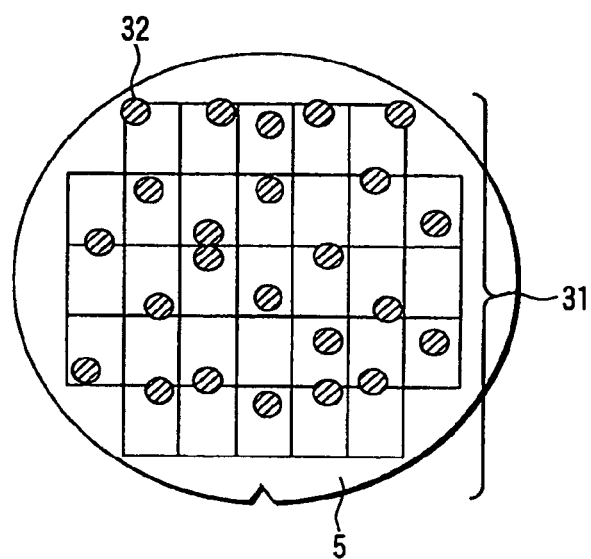
FIG. 6 is a diagram showing an example of a surface state of an exposed wafer transported into a transporting apparatus from the inside of an exposure apparatus.

FIG. 6 shows an example of a surface state of an immersion-exposed wafer transported into the transporting apparatus 3 from the inside of the exposure apparatus 2. On a surface of the wafer 5, as shown in FIG. 6, liquid 32 used in immersion exposure may remain on an exposure region 31 sometimes. When the wafer 5 in this state is processed by the lithography apparatus, there arises the problem that the lithography apparatus is contaminated.

In the present embodiment, a lithography apparatus and method which can solve the above problem in the transporting apparatus 3 before the wafer 5 is transported into the resist processing apparatus 1 will be described below.

Figure 7:
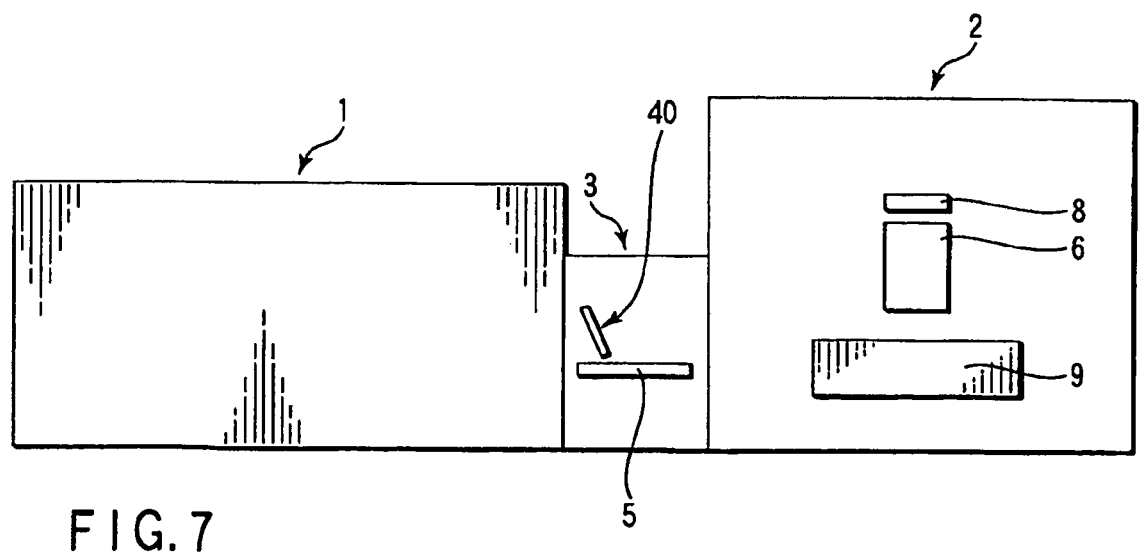
FIG. 7 is a diagram showing a schematic configuration of a lithography apparatus according to the fifth embodiment of the present invention.

FIG. 7 is a diagram showing a schematic configuration of a lithography apparatus according to the present embodiment. The same reference numerals as in FIG. 1 denote the same parts in FIG. 7, and a description thereof (configuration, effect, and the like) will be omitted.

In the lithography apparatus according to the present embodiment, a moisture removing mechanism (liquid removing apparatus) 40 is provided in the transporting apparatus 3. The moisture removing mechanism 40 is a mechanism which removes liquid remaining on the surface of the wafer 5. A specific example of the moisture removing mechanism 40 will be described later.

A pattern forming method using the lithography apparatus of the present embodiment will be described below.

At first, the wafer 5 is carried into the resist processing apparatus 1. Thereafter, a resist is applied on the wafer 5 by the resist processing apparatus 1 to form the resist film on the wafer 5. Depending on the resist, a protecting film is provided on the resist film. The protecting film is a film to suppress a material in the resist from being dissolved into the immersion liquid which may arise in the immersion exposure process executed later or to suppress the immersion liquid from being penetrated into the resist which may arise in the immersion exposure process executed later.

The wafer 5 is transported into the exposure apparatus 2 from the inside of the resist processing apparatus 1 through the transporting apparatus 3. Thereafter, the pattern exposure is performed in a state that immersion liquid is interposed between the exposure region of the resist film and the projector lens 6.

Next, the exposed wafer 5 which the immersion exposure has finished is carried out of the exposure apparatus 2 and carried into the transporting apparatus 3.

Next, liquid remaining on the surface of the wafer 5 is removed by the moisture removing mechanism 40.

Next, the wafer 5 is transported into the resist processing apparatus 1 from the transporting apparatus 3.

Next, a baking process is performed to the resist film of the wafer 5 to which the pattern exposure is performed by the resist processing apparatus 1, further, the developing process is performed to the resist film of the wafer 5. As a result, a resist pattern is formed on the wafer 5.

At this time, since liquid does not remain on the surface of the wafer 5, and so the inside of the resist processing apparatus 1 can be prevented from being contaminated. Further, a heating spot caused by evaporation of the remaining water which arises in the baking process is not formed, and generation of defect (fault) of the resist pattern caused by the remaining liquid is prevented.

Thereafter, the known steps such as the step of etching of the wafer 5 by using the resist pattern as a mask are performed, so that a semiconductor device is completed.

The position where the moisture removing mechanism 40 is installed is not limited to that in the example in FIG. 7. The moisture removing mechanism 40 may be provided at other installation positions as long as they are on the transporting path of the wafer 5 between the exposure apparatus 2 and the resist processing apparatus 1.

Figure 8:
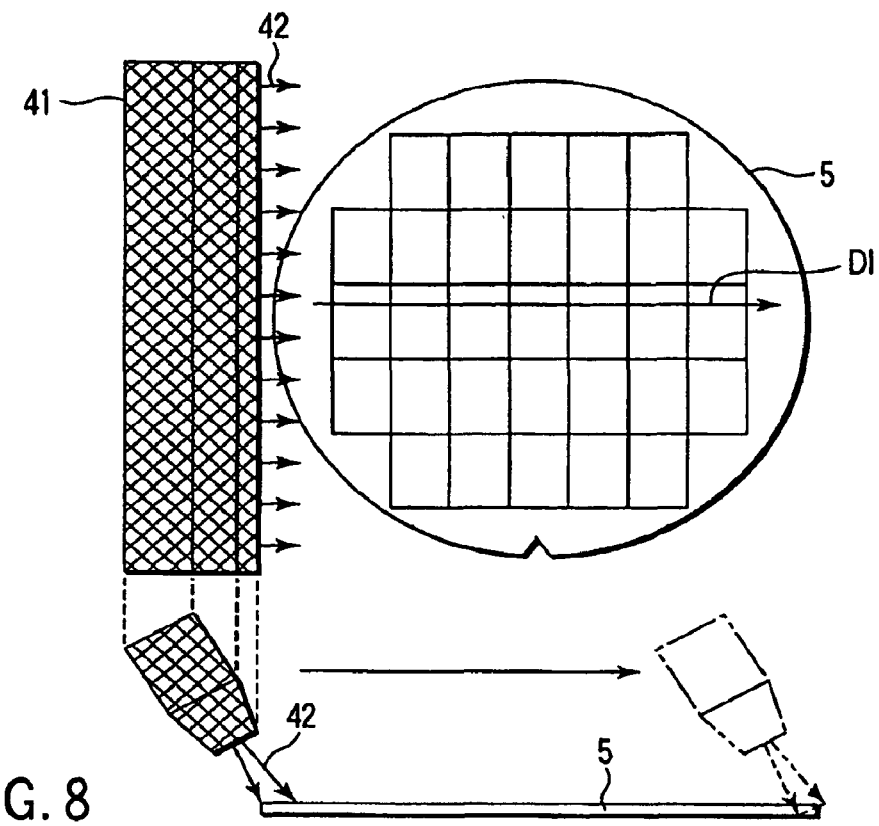
FIG. 8 is a diagram schematically showing an air knife serving as one of the specific examples of a moisture removing mechanism.

FIG. 8 is a diagram schematically showing an air knife 41 as one of the specific examples of the moisture removing mechanism 40. The remaining liquid on the wafer 5 is removed by air flow 42 from the air knife 41 onto the surface of the wafer 5 and by scanning the air knife 41 above the wafer 5 along a direction D1 in FIG. 8.

Figure 9:
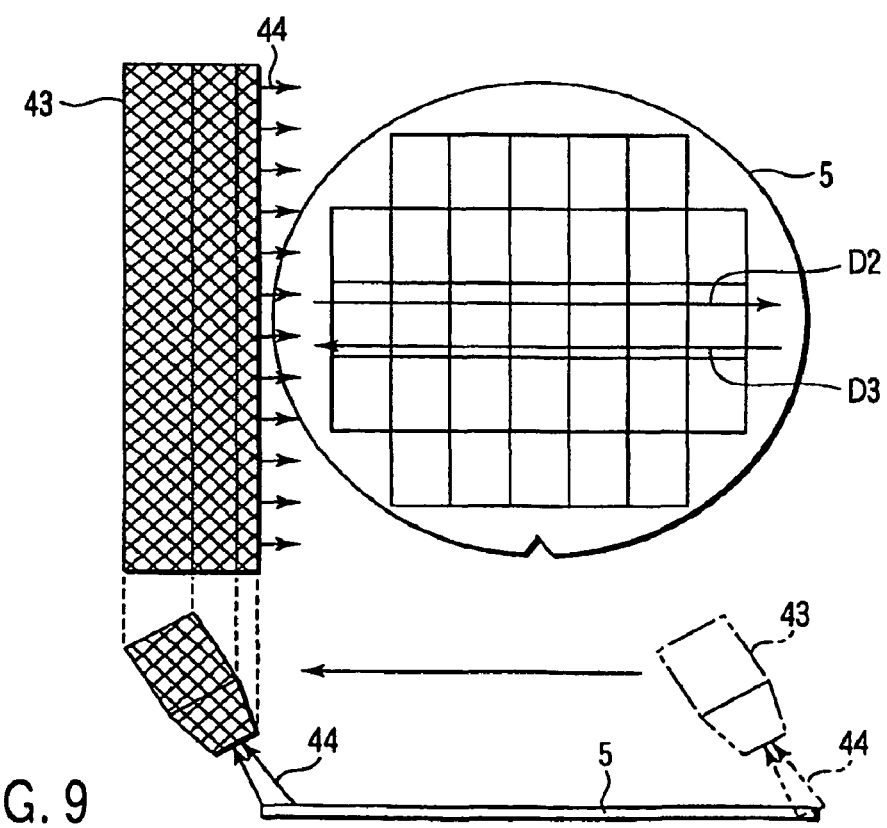
FIG. 9 is a diagram schematically showing a suction nozzle serving as one of the specific examples of the moisture removing mechanism.

FIG. 9 is a diagram schematically showing a suction nozzle 43 as one of the specific examples of the moisture removing mechanism 40. The remaining liquid on the wafer 5 is removed by sucking the remaining liquid on the wafer 5 by the suction nozzle 43 and by scanning the air knife 41 above the wafer 5 along a direction D2 or D3 in FIG. 9. Reference numeral 44 in FIG. 9 denotes air flowing from the wafer 5 to the suction nozzle 43.

The moisture removing mechanism 40 is provided in the transporting apparatus 3, not in the exposure apparatus 2, for the following reason.

As a moisture removing mechanism to remove the remaining liquid on the wafer in the exposure apparatus 2, a mechanism including a chamber which stores wafers and a mechanism to remove the remaining liquid on the wafers stored in the chamber is considered.

The moisture in the exposure apparatus 2 can be prevented from adhering to the wafer by putting the wafer into the chamber during removing the remaining liquid on the wafer.

After the removal of the remaining liquid, the wafer is taken out of the chamber. The wafer taken out of the chamber is transported into the resist processing apparatus 1 through the transporting apparatus 3.

Here, the wafer taken out of the chamber is exposed in an atmosphere containing moisture in the exposure apparatus 2. Therefore, there is a possibility that the moisture adheres to the wafer 5 again.

If the wafer 5 on which moisture adhered passes the transporting apparatus 3 or the resist processing apparatus 1, the temperature or the humidity in the transporting apparatus 3 or the resist processing apparatus 1 varies.

If the temperature and the humidity in the transporting apparatus 3 or the resist processing apparatus 1 varies, dimensional controllability and alignment accuracy which are important in the lithography step are degraded, and a designed resist pattern cannot be easily formed.

Further, if the wafer 5 which the immersion exposure has finished is processed by the resist processing apparatus 1 in a state that moisture remains on the surface of the wafer 5, the inside of the resist processing apparatus 1 is contaminated.

To prevent those problems from arising, in the present embodiment, the moisture removing mechanism 40 is provided in the transporting apparatus 3, not in the exposure apparatus 2.

Sixth Embodiment

Figure 10:
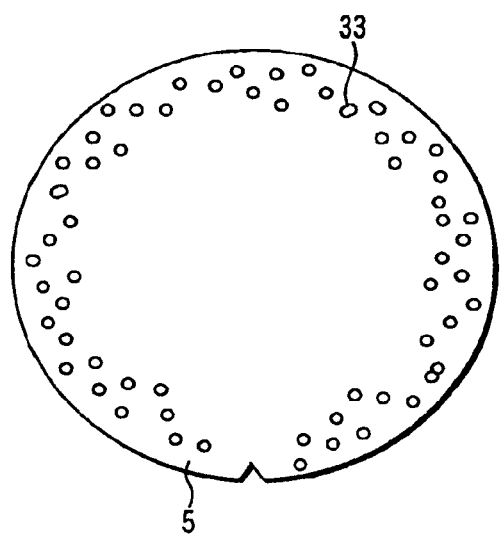
FIG. 10 is a diagram showing an example of a rear surface state of an immersion-exposed wafer transported into a transporting apparatus from the inside of an exposure apparatus.

FIG. 10 shows an example of a rear surface state of an immersion-exposed wafer 5 transported into the transporting apparatus 3 from the interior of the exposure apparatus 2. The rear surface of the wafer 5 may be contaminated sometimes such that material (contaminant) 33 extracted from the surface (front surface) of the wafer 5 gets around the wafer 5 to its rear surface in the immersion exposure process. If the wafer 5 in this state is processed by the lithography apparatus, there arises the problem that the lithography apparatus is contaminated.

In the present embodiment, a lithography apparatus and method which can solve the above problem in the transporting apparatus 3 before the wafer 5 is transported into the resist processing apparatus 1 will be described below.

Figure 11:
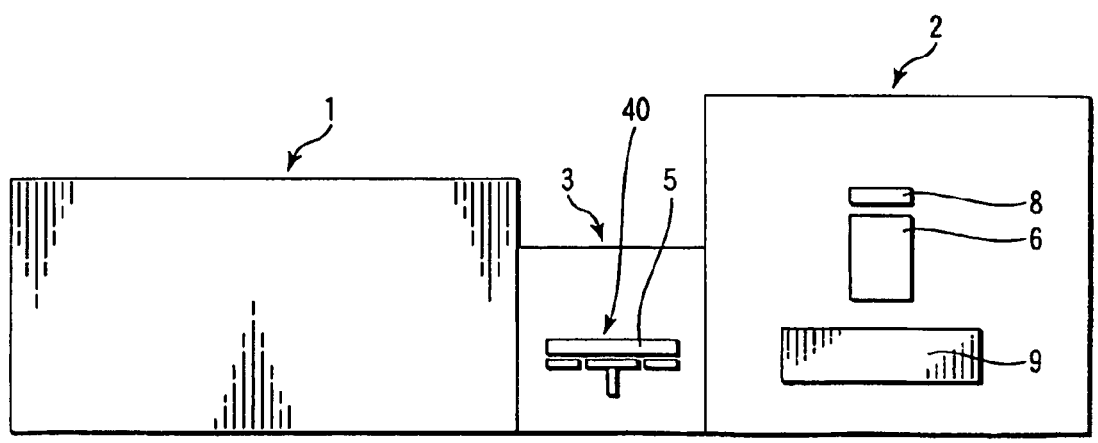
FIG. 11 is a diagram showing a schematic configuration of a waiting unit in a lithography apparatus according to the sixth embodiment of the present invention.

FIG. 11 is a diagram showing a schematic configuration of the lithography apparatus according to the present embodiment. The same reference numerals as in FIG. 1 denote the same parts in FIG. 11, and description thereof (configuration, effect, and the like) will be omitted.

In the lithography apparatus of the present embodiment, a rear-surface cleaning mechanism (cleaning apparatus) 40' is provided in the transporting apparatus 3. The rear-surface cleaning mechanism 40' is a mechanism which removes contaminants remaining on the rear surface of the wafer 5. A specific example of the rear-surface cleaning mechanism 40' will be described later.

A pattern forming method using the lithography apparatus of the present embodiment will be described below.

At first, the wafer 5 is transported into the resist processing apparatus 1. Thereafter, a resist is applied on the wafer 5 by the resist processing apparatus 1 to form a resist film on the wafer 5. Depending on the resist, the protecting film is provided on the resist film to suppress a material in the resist from being dissolved into the immersion liquid which may arise in the immersion exposure process executed later or to suppress the immersion liquid from being penetrated into the resist which may arise in the immersion exposure process executed later.

Next, the wafer 5 is transported into the exposure apparatus 2 from the inside of the resist processing apparatus 1 through the transporting apparatus 3. Thereafter, the pattern exposure is performed in a state that immersion liquid is interposed between the exposure region of the resist film and a projector lens 6.

The exposed wafer 5 which the immersion exposure has finished is carried out of the inside of the exposure apparatus 2 and is carried into the transporting apparatus 3.

Contaminants remaining on the rear surface of the wafer 5 are removed by the rear-surface cleaning mechanism 40'.

The wafer 5 is transported into the resist processing apparatus 1 from the transporting apparatus 3.

Next, the baking process is performed to the resist film of the wafer 5 to which the pattern exposure is performed by the resist processing apparatus 1, further, the developing process is performed to the resist film of the wafer 5. As a result, the resist pattern is formed on the wafer 5.

At this time, since contaminants do not remain on the rear surface of the wafer 5, the inside of the resist processing apparatus 1 can be prevented from being contaminated. Further, a heating spot caused by evaporation of the remaining water on the rear surface which arises in the baking process is not formed, and generation of defect (fault) of the resist pattern caused by the remaining liquid is prevented.

Thereafter, the known steps such as the step of etching of the wafer 5 by using the resist pattern as a mask are performed, so that a semiconductor device is completed.

The position where the rear-surface cleaning mechanism 40' is installed is not limited to that in the example in FIG. 11.

The rear-surface cleaning mechanism 40' may be provided at other installation positions as long as they are on the transporting path of the wafer 5 between the exposure apparatus 2 and the resist processing apparatus 1.

Figure 12:
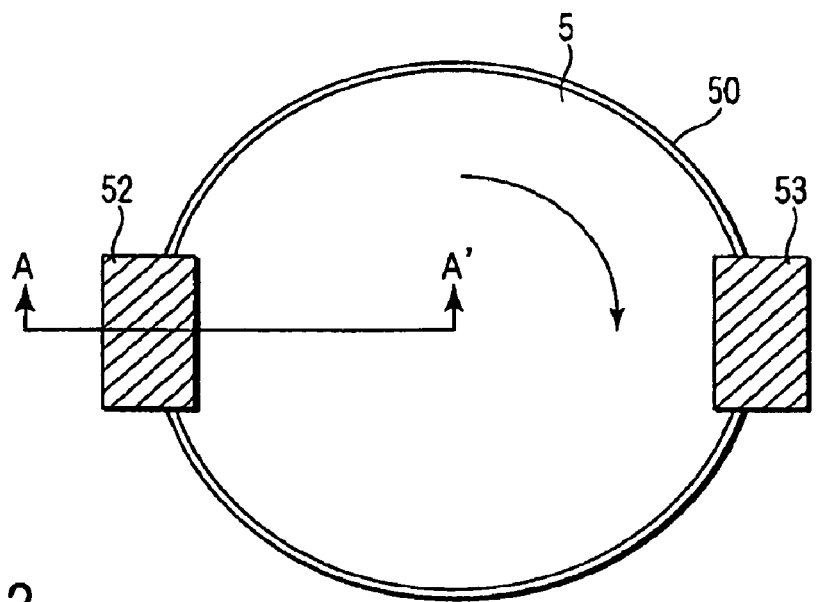
FIG. 12 is a plan view showing a specific example of a rear surface cleaning mechanism.
Figure 13:
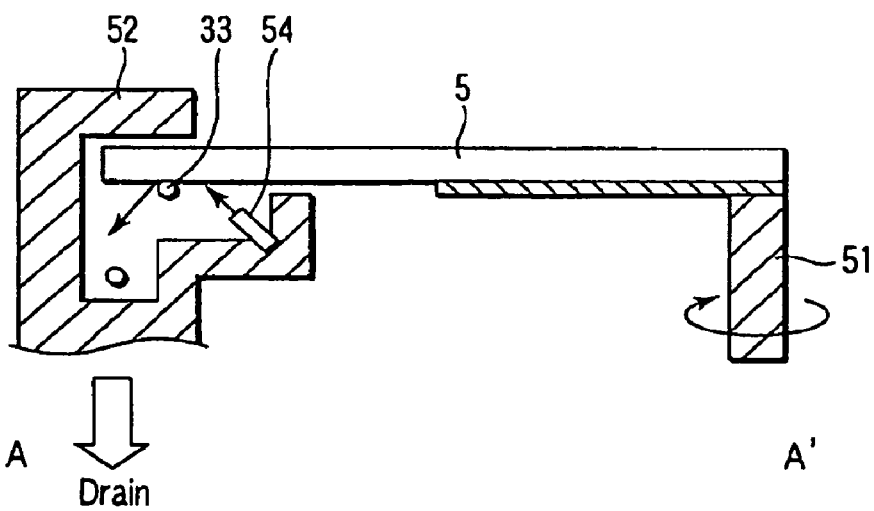
FIG. 13 is a sectional view taken along an arrow A-A' in FIG. 12.

FIG. 12 is a sectional view showing a specific example of the rear-surface cleaning mechanism 40'. FIG. 13 is a sectional view taken along an arrow A-A' in FIG. 12.

The rear-surface cleaning mechanism 40' includes a stage which the wafer 5 is placed on and is rotated by a rotating mechanism 51, a tray 50 arranged the circumference of wafer, a cleaning unit 52 to clean the rear surface of the outer portion of the wafer 5, and a dry unit 53 to dry the rear surface of the outer portion of the wafer 5.

The shape of the rotatable tray 50 is typically circular or ring-shaped, however, a rectangular shape or the like may be employed.

The cleaning unit 52 includes a cleaning nozzle 54. The contaminants 33 remaining on the rear surface of the wafer 5 are cleaned by discharging cleaning liquid out of the tip of the cleaning nozzle 54 while the wafer 5 is slowly rotated by the rotating mechanism 51.

As the cleaning liquid, for example, water, ozone water, hydrogen water, carbonic water, or alcohol is used. The cleaning liquid is stored in a vessel (not shown), and the cleaning liquid stored in the vessel is discharged from the tip of the cleaning nozzle 54 by a liquid discharge mechanism (not shown). In a case where that the cleaning liquid drips out of the wafer 5 during the cleaning of the rear surface of the wafer 5, it is better to use the tray 50 which is slightly larger than the circumference of the wafer 5.

After the cleaning, the rear surface of the outer portion of the wafer 5 is dried by heating the rear surface of the outer portion of the wafer 5 with the dry unit 53 including a heater while the wafer 5 is rotated by the rotating mechanism 51.

The time from the cleaning of the rear surface of the outer portion of the wafer 5 to the drying thereof is desirably shorter than time for an exposing process of one wafer. When the time is equal to or longer than the time for the exposing process, idling time of the exposure apparatus 2 increases to degrade the productivity.

A lithography apparatus including the rear-surface cleaning mechanism 40' of the present embodiment and the moisture removing mechanism 40 of the fifth embodiment can also be executed. The lithography apparatus which incorporates the rear-surface cleaning mechanism 40' with the moisture removing mechanism 40 makes it possible to easily and effectively solve problems caused by liquid inherent in immersion exposure. Furthermore, a lithography method and apparatus obtained by combining the present embodiment (or combination with the fifth embodiment) and any one of the first to fourth embodiments can also be executed.

In the present embodiment and the fifth embodiment, the moisture removing mechanism for the rear surface of the wafer and the cleaning function for the rear surface of the wafer are provided on the transporting portion. However, these mechanisms may be provided on a return port of the resist processing apparatus when viewed from the immersion exposure apparatus to perform processing.

The present invention is not limited to the embodiments. For example, the effects of the present invention can be sufficiently achieved even though an antireflection film is formed prior to the formation of a resist film.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A lithography apparatus comprising:
   a resist processing apparatus to perform a process of applying a resist on a substrate to be processed, a process of heating a resist film formed on the substrate, and a process of developing the resist film formed on the substrate;
   an immersion exposure apparatus including a projection optical system which projects an image of a pattern formed on a photomask onto the resist film formed on the substrate and configured to perform exposure through liquid located on an optical path between the projection optical system and the resist film;
   a transporting apparatus connected to the resist processing apparatus and the immersion exposure apparatus to perform transportation of the substrate between the resist processing apparatus and the immersion exposure apparatus; and
   a temperature/humidity control apparatus configured to control temperature and humidity or the humidity in at least one of the resist processing apparatus and the transporting apparatus based on temperature and humidity or the humidity in the immersion exposure apparatus.

2. The lithography apparatus according to claim 1, wherein the temperature/humidity control apparatus comprises:
   a temperature/humidity adjusting unit configured to adjust the temperature and humidity or the humidity in the transporting apparatus;
   a first temperature/humidity sensor configured to monitor the temperature and the humidity or the humidity in the transporting apparatus;
   a second temperature/humidity sensor configured to monitor the temperature and the humidity or the humidity in the exposure apparatus; and
   a control unit configured to control the temperature/humidity adjusting unit such that a variation in temperature of the substrate is suppressed based on temperature information and humidity information in the transporting apparatus and the immersion exposure apparatus obtained by the first and second temperature/humidity sensors when the substrate in the transporting apparatus is transported into the immersion exposure apparatus.

3. The lithography apparatus according to claim 1, wherein the temperature/humidity control apparatus comprises:
   a temperature/humidity adjusting unit configured to adjust temperature and humidity or the humidity at a portion where the substrate waits in the immersion exposure apparatus;
   a first temperature/humidity sensor configured to monitor the temperature and the humidity or the humidity at the portion where the substrate waits;
   a second temperature/humidity sensor configured to monitor temperature and humidity or the humidity at a position in a vicinity of a portion where exposure is performed in the immersion exposure apparatus; and
   a control unit for configured to control the temperature/humidity adjusting unit such that a variation in temperature information and humidity information in the immersion exposure apparatus obtained by the first and second temperature/humidity sensors when the substrate is transported from the portion where the substrate waits into the portion where the exposure is performed.

4. The lithography apparatus according to claim 1, wherein the temperature/humidity control apparatus comprises:
   a temperature/humidity adjusting unit configured to adjust temperature and humidity or the humidity in the resist processing apparatus:
   a first temperature/humidity sensor configured to monitor the temperature and humidity or the humidity in the resist processing apparatus;
   a second temperature/humidity sensor configured to monitor the temperature and the humidity or the humidity in the immersion exposure apparatus; and
   a control unit configured to control the temperature/humidity adjusting unit such that a variation in temperature of the substrate is suppressed based on temperature information and humidity information in the resist processing apparatus and the immersion exposure apparatus obtained by the first and second temperature/humidity sensors when the substrate is transported into the immersion exposure apparatus from an inside of the resist processing apparatus through the transporting apparatus or when the substrate is transported into the resist processing apparatus from an inside of the immersion exposure apparatus through the transporting apparatus.

5. A method for forming a pattern comprising:
   transporting a substrate to be processed into a resist processing apparatus;
   forming a resist film on the substrate by applying a resist on the substrate using the resist processing apparatus;
   transporting the substrate in the resist processing apparatus into a transporting apparatus connected to the resist processing apparatus;
   controlling temperature and humidity or the humidity in the transporting apparatus based on temperature and humidity or the humidity in an immersion exposure apparatus connected to the transporting apparatus;
   transporting the substrate in the transporting apparatus into the immersion exposure apparatus which the at least one of the temperature and humidity is controlled;
   performing pattern exposure to the resist film on the substrate using the immersion exposure apparatus;
   transporting the substrate in the immersion exposure apparatus into the resist processing apparatus; and
   forming a resist pattern by performing a baking process and a developing process to the resist film which the pattern exposure to the substrate is performed using the resist processing apparatus.

6. The method for forming a pattern according to claim 5, wherein the controlling the temperature and the humidity or the humidity in the transporting apparatus includes controlling the temperature and the humidity or the humidity in the transporting apparatus such that a variation in temperature of the substrate is suppressed when the substrate in the transporting apparatus is transported into the immersion exposure apparatus.

7. A method for forming a pattern comprising:
   transporting a substrate to be processed into a resist processing apparatus;
   forming a resist film on the substrate by applying a resist on the substrate using the resist processing apparatus;
   transporting the substrate in the resist processing apparatus into a transporting apparatus connected to the resist processing apparatus;
   transporting the substrate in the transporting apparatus into an immersion exposure apparatus connected to the transporting apparatus;

performing pattern exposure to the resist film on the substrate using the immersion exposure apparatus;

transporting the substrate in the immersion exposure apparatus into the transporting apparatus;

controlling at temperature and humidity or the humidity in the resist processing apparatus based on temperature and humidity or the humidity in the immersion exposure apparatus;

transporting the substrate in the transporting apparatus into the resist processing apparatus which the temperature and the humidity or the humidity is controlled; and forming a resist pattern by performing a baking process and a developing process to the resist film which the pattern exposure to the substrate is performed using the resist processing apparatus.

8. The method for forming a pattern according to claim 7, wherein the controlling the temperature and the humidity or the humidity in the resist processing apparatus includes controlling the temperature and the humidity or the humidity in the resist processing apparatus such that a variation in temperature of the substrate is suppressed when the substrate in the transporting apparatus is transported into the resist processing apparatus.

9. A method for manufacturing a semiconductor device comprising:

transporting a substrate to be processed into a resist processing apparatus;

forming a resist film on the substrate by applying a resist on the substrate using the resist processing apparatus;

transporting the substrate in the resist processing apparatus into a transporting apparatus connected to the resist processing apparatus;

controlling temperature and humidity or the humidity in the transporting apparatus based on temperature and humidity or the humidity in an immersion exposure apparatus connected to the transporting apparatus;

transporting the substrate in the transporting apparatus into the immersion exposure apparatus which the at least one of the temperature and humidity is controlled;

performing pattern exposure to the resist film on the substrate using the immersion exposure apparatus;

transporting the substrate in the immersion exposure apparatus into the resist processing apparatus; and forming a resist pattern by performing a baking process and a developing process to the resist film which the pattern exposure to the substrate is performed using the resist processing apparatus.

10. A method for manufacturing a semiconductor device comprising:

transporting a substrate to be processed into a resist processing apparatus;

forming a resist film on the substrate by applying a resist on the substrate using the resist processing apparatus;

transporting the substrate in the resist processing apparatus into a transporting apparatus connected to the resist processing apparatus;

transporting the substrate in the transporting apparatus into an immersion exposure apparatus connected to the transporting apparatus;

performing pattern exposure to the resist film on the substrate using the immersion exposure apparatus;

transporting the substrate in the immersion exposure apparatus into the transporting apparatus;

controlling at temperature and humidity or the humidity in the resist processing apparatus based on temperature and humidity or the humidity in the immersion exposure apparatus;

transporting the substrate in the transporting apparatus into the resist processing apparatus which the temperature and the humidity or the humidity is controlled; and forming a resist pattern by performing a baking process and a developing process to the resist film which the pattern exposure to the substrate is performed using the resist processing apparatus.

* * * * *

UNITED STATES PATENT AND TRADEMARK OFFICE
CERTIFICATE OF CORRECTION

| | | |
|---|---|---|
| PATENT NO. | : 7,796,237 B2 | Page 1 of 1 |
| APPLICATION NO. | : 12/341179 | |
| DATED | : September 14, 2010 | |
| INVENTOR(S) | : Ito et al. | |

It is certified that error appears in the above-identified patent and that said Letters Patent is hereby corrected as shown below:

Title page, Item (57), in the Abstract, line 16, change "the in humidity the immersion" to --the humidity in the immersion--.

Claim 3, column 17, line 61, change "unit for" to --unit--.

* Claim 7, column 19, line 5, change "controlling at" to --controlling--.

* Claim 10, column 20, line 26, change "controlling at" to --controlling--.

Signed and Sealed this

Seventh Day of December, 2010

David J. Kappos
*Director of the United States Patent and Trademark Office*